US012757657B2

(12) United States Patent
Kim et al.

(10) Patent No.: US 12,757,657 B2
(45) Date of Patent: Oct. 6, 2026

(54) TREATING SILICON NITRIDE BASED DIELECTRIC FILMS

(71) Applicant: Applied Materials, Inc., Santa Clara, CA (US)

(72) Inventors: Dongjoon Kim, Santa Clara, CA (US); Xiang Ji, Sunnyvale, CA (US); Shuchi Sunil Ojha, Redwood City, CA (US); Praket Prakash Jha, San Jose, CA (US); Jingmei Liang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 376 days.

(21) Appl. No.: 18/397,861

(22) Filed: Dec. 27, 2023

(65) Prior Publication Data

US 2025/0218763 A1 Jul. 3, 2025

(51) Int. Cl.
*H10P 14/694* (2026.01)
*C23C 16/34* (2006.01)
(Continued)

(52) U.S. Cl.
CPC ...... *H10P 14/69433* (2026.01); *C23C 16/345* (2013.01); *C23C 16/402* (2013.01); (Continued)

(58) Field of Classification Search
CPC ................... H10P 14/65–69433; C23C 16/402
See application file for complete search history.

(56) References Cited

U.S. PATENT DOCUMENTS 6,756,085 B2 6/2004 Waldfried et al.
8,084,356 B2 12/2011 Dordi et al.
(Continued)

FOREIGN PATENT DOCUMENTS

KR 101362025 B1 2/2014

OTHER PUBLICATIONS

Provine et al., "Correlation of film density and wet etch rate in hydrofluoric acid of plasma enhancedatomic layer deposited silicon nitride" AIP Advances 6, 065012 (2016), 9 pages.
(Continued)

*Primary Examiner* — William B Partridge
*Assistant Examiner* — Gustavo G Ramallo
(74) *Attorney, Agent, or Firm* — Patterson + Sheridan, LLP

(57) ABSTRACT

The present disclosure provides methods of gap fill deposition. The methods include forming a silicon-nitride based dielectric film by providing a substrate into a processing chamber. An amorphous silica layer is formed on a surface of the substrate by flowing a dielectric precursor on the substrate. A modified amorphous silica layer is formed by flowing a reactive gas into the processing chamber. A thermal etching process is performed on the modified amorphous silica layer by flowing a fluorine-containing compound at a temperature of about 400° C. to about 600° C. A silicon-nitride based dielectric film is formed by reacting the modified amorphous silica layer with one or more radicals generated by a remote plasma source. An etched silicon-nitride based dielectric film is formed by flowing a fluorine-containing compound to the processing chamber with plasma. The etched silicon-nitride based dielectric film is exposed to a hydrogen recovery process.

20 Claims, 8 Drawing Sheets

(51) Int. Cl.

| | |
|---|---|
| ***C23C 16/40*** | (2006.01) |
| ***C23C 16/50*** | (2006.01) |
| ***C23C 16/56*** | (2006.01) |
| ***H10P 14/60*** | (2026.01) |
| ***H10P 14/692*** | (2026.01) |
| ***H10P 50/28*** | (2026.01) |

(52) U.S. Cl.
CPC .............. *C23C 16/50* (2013.01); *C23C 16/56* (2013.01); *H10P 14/6529* (2026.01); *H10P 14/69215* (2026.01); *H10P 50/283* (2026.01)

(56) References Cited

U.S. PATENT DOCUMENTS

| | | | | |
|---|---|---|---|---|
| 8,101,531 | B1 | 1/2012 | Li et al. | |
| 8,304,351 | B2 | 11/2012 | Wang et al. | |
| 8,318,584 | B2 | 11/2012 | Li et al. | |
| 8,445,078 | B2 | 5/2013 | Liang et al. | |
| 8,524,612 | B2 | 9/2013 | Li et al. | |
| 8,575,819 | B1 | 11/2013 | Bhugra et al. | |
| 8,846,536 | B2 | 9/2014 | Draeger et al. | |
| 9,214,333 | B1 | 12/2015 | Sims et al. | |
| 9,299,559 | B2 | 3/2016 | Draeger et al. | |
| 9,570,287 | B2 | 2/2017 | Liang et al. | |
| 9,685,320 | B2 | 6/2017 | Kang et al. | |
| 9,941,445 | B2 | 4/2018 | Escoubas et al. | |
| 10,041,167 | B2 | 8/2018 | Liang et al. | |
| 10,109,481 | B2 | 10/2018 | Zhu et al. | |
| 10,157,736 | B2 | 12/2018 | van Schravendijk et al. | |
| 10,566,186 | B2 | 2/2020 | van Schravendijk et al. | |
| 10,707,116 | B2 | 7/2020 | Liang et al. | |
| 10,763,107 | B2 | 9/2020 | Van Schravendijk et al. | |
| 2004/0018319 | A1 | 1/2004 | Waldfried et al. | |
| 2005/0159017 | A1* | 7/2005 | Kim | C23C 16/345 438/791 |
| 2007/0082507 | A1* | 4/2007 | Iyer | C23C 16/345 438/795 |
| 2007/0298585 | A1 | 12/2007 | Lubomirsky et al. | |
| 2011/0195559 | A1 | 8/2011 | Chen et al. | |
| 2012/0003840 | A1 | 1/2012 | Wang et al. | |
| 2012/0077349 | A1 | 3/2012 | Li et al. | |
| 2012/0112188 | A1 | 5/2012 | Yokoyama | |
| 2012/0135212 | A1 | 5/2012 | Chang et al. | |
| 2012/0149213 | A1 | 6/2012 | Nittala et al. | |
| 2012/0266819 | A1 | 10/2012 | Sanchez et al. | |
| 2012/0269989 | A1 | 10/2012 | Liang et al. | |
| 2012/0276407 | A1 | 11/2012 | Chang et al. | |
| 2013/0029096 | A1 | 1/2013 | Chang et al. | |
| 2013/0049064 | A1 | 2/2013 | Daigo et al. | |
| 2013/0217240 | A1 | 8/2013 | Mallick et al. | |
| 2013/0217241 | A1 | 8/2013 | Underwood et al. | |
| 2013/0230987 | A1 | 9/2013 | Draeger et al. | |
| 2013/0288485 | A1 | 10/2013 | Liang et al. | |
| 2013/0319329 | A1 | 12/2013 | Li et al. | |
| 2014/0011013 | A1 | 1/2014 | Jin et al. | |
| 2014/0017904 | A1 | 1/2014 | Gauri et al. | |
| 2014/0030830 | A1 | 1/2014 | Lee et al. | |
| 2014/0134812 | A1 | 5/2014 | Kim et al. | |
| 2014/0302690 | A1 | 10/2014 | Underwood et al. | |
| 2014/0329027 | A1 | 11/2014 | Liang et al. | |
| 2015/0044882 | A1 | 2/2015 | Draeger et al. | |
| 2015/0179501 | A1 | 6/2015 | Jhaveri et al. | |
| 2015/0348773 | A1 | 12/2015 | Zhu et al. | |
| 2016/0020092 | A1 | 1/2016 | Kang et al. | |
| 2016/0126089 | A1 | 5/2016 | Liang et al. | |
| 2016/0194758 | A1 | 7/2016 | Nemani et al. | |
| 2016/0244879 | A1 | 8/2016 | Liang et al. | |
| 2017/0194430 | A1 | 7/2017 | Wood et al. | |
| 2017/0323785 | A1 | 11/2017 | Singhal et al. | |
| 2017/0323803 | A1 | 11/2017 | van Schravendijk et al. | |
| 2018/0182613 | A1 | 6/2018 | Blanquart et al. | |
| 2018/0330980 | A1 | 11/2018 | Liang et al. | |
| 2019/0157078 | A1 | 5/2019 | van Schravendijk et al. | |
| 2019/0326123 | A1 | 10/2019 | Li et al. | |
| 2020/0032389 | A1 | 1/2020 | Lei et al. | |
| 2020/0152452 | A1 | 5/2020 | van Schravendijk et al. | |
| 2020/0286773 | A1 | 9/2020 | Liang et al. | |
| 2022/0084817 | A1 | 3/2022 | Sharma et al. | |
| 2024/0290612 | A1* | 8/2024 | Shen | C23C 16/04 |
| 2024/0360996 | A1* | 10/2024 | Olsen | C01B 33/126 |

OTHER PUBLICATIONS

Martirosyan (J. Vac. Sci. Technol. A 36(4), Jul./Aug. 2018) (Year: 2018).

International Search Report and Written Opinion issued to Application No. PCT/US2024/048504 on Jan. 7, 2025 in 12 pages.

* cited by examiner

| Example | Blanket THK(Å) | Blanket Refractive Index | Blanket Non-uniformity (3σ)% | Blanket Defects | TEM CD25 | | | |
|---|---|---|---|---|---|---|---|---|
| Reference | 104.8 | 1.934 | 29.2 | 13 |  50 nm | | | |
| | | | | | Bottom(nm) | Sidewall (nm) | Top (nm) | Bottom/ Top |
| | | | | | 8.6 | 1.1 | 9.4 | 0.9 |
| Example 1 | 103.7 | 1.938 | 7.2 | 11 |  | | | |
| | | | | | Bottom(nm) | Sidewall (nm) | | Bottom/ Top |
| | | | | | 5.7 | 0.6 | 1.6 | 3.5 |

TREATING SILICON NITRIDE BASED DIELECTRIC FILMS

BACKGROUND

Field

Embodiments of the present disclosure generally relate to fabrication of microelectronic devices, and more specifically, relate to gap fill deposition and film densification during the fabrication of microelectronic devices.

Description of the Related Art

Semiconductor device geometries have dramatically decreased in size since their introduction several decades ago. Modern semiconductor fabrication equipment routinely produce devices with feature sizes of 10 nm and sub-10 nm, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with dielectric material. As a result, the deposition of dielectric material is prone to clog at the top before the gap is completely filled, producing a void or seam in the middle of the gap.

Over the years, many techniques have been developed to avoid having dielectric material clog the top of a gap, or to "heal" the void or seam that has been formed. One approach has been to etch the dielectric material to remove the material clog at the top of the gap. Unfortunately, during the etching process, the bottom of the gap etches faster than the top of the gap, reducing the thickness of the dielectric material at the bottom of the gap, and preventing a uniform deposition. Conventionally, selective etching has been implemented to limit the bottom of the gap from etching at the same rate as the top of the gap. However, approaches to control etching selectivity of the dielectric material generally require adjusting one or more process conditions during the dielectric material deposition, leading to bubbles forming in the dielectric material.

Therefore, there is a need for an improved method of gap fill deposition.

SUMMARY

The present disclosure provides methods of gap fill deposition. The methods include forming a silicon-nitride based dielectric film. The method includes providing a substrate into a processing chamber. An amorphous silica layer is formed on a surface of the substrate by flowing a dielectric precursor and a carrier gas on the substrate. A modified amorphous silica layer is formed by flowing a reactive gas into the processing chamber. A thermal etching process is performed on the modified amorphous silica layer by flowing a fluorine-containing compound at a temperature of about 400° C. to about 600° C. A silicon-nitride based dielectric film is formed by reacting the modified amorphous silica layer with one or more radicals generated by a remote plasma source.

The present disclosure also provides methods of gap fill deposition. The methods include forming a silicon-nitride based dielectric film. The method includes providing a substrate into a processing chamber. An amorphous silica layer is formed on a surface of the substrate by flowing a dielectric precursor and a carrier gas on the substrate. A modified amorphous silica layer is formed by flowing a reactive gas into the processing chamber. A silicon-nitride based dielectric film is formed by reacting the modified amorphous silica layer with one or more radicals generated by a remote plasma source. An etched silicon-nitride based dielectric film is formed by flowing a fluorine-containing compound to the processing chamber in the presence of a plasma.

The present disclosure also provides methods of gap fill deposition. The methods include forming a silicon-nitride based dielectric film. The method includes providing a substrate into a processing chamber. An amorphous silica layer is formed on a surface of the substrate by flowing a dielectric precursor and a carrier gas on the substrate. A modified amorphous silica layer is formed by flowing a reactive gas into the processing chamber. A silicon-nitride based dielectric film is formed by reacting the modified amorphous silica layer with one or more radicals generated by a remote plasma source. An etched silicon-nitride based dielectric film is formed by flowing a fluorine-containing compound to the processing chamber in the presence of a plasma. The etched silicon-nitride based dielectric film is exposed to a hydrogen recovery process in the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide methods of depositing silicon nitride (SiN)-based dielectric films on a substrate. The SiN-based dielectric films may be treated using a plasma treatment. Additionally, a hydrogen recovery process may be performed which can remove one or more defects from the treated SiN-based dielectric film. A SiN-based dielectric film contains silicon-nitrogen (Si—N—Si) bonds. A SiN-based dielectric film, as deposited on the substrate, may contain a large amount of silicon-hydrogen (Si—H) and nitrogen-hydrogen (N—H) bonds as a result of cross-linking of Si—H near a surface of the deposited SiN-based dielectric film, causing insufficient filling of gaps and trenches. The methods described herein include depositing SiN-based dielectric films on a substrate (e.g., one layer at a time) to prevent buildup of the precursors over a gap of the substrate. Moreover, the SiN-based dielectric films may be etched with $NF_3$, where $NF_3$ becomes a strong oxidizing agent with the use of high temperatures, e.g., greater than 450° C. and an argon-based plasma such that the top of the gap may be selectively etched with limited etching of the bottom of the gap. The SiN-based dielectric film may then be exposed to a hydrogen recovery process to remove defects in the SiN-based dielectric film resulting from the $NF_3$.

Figure 1:
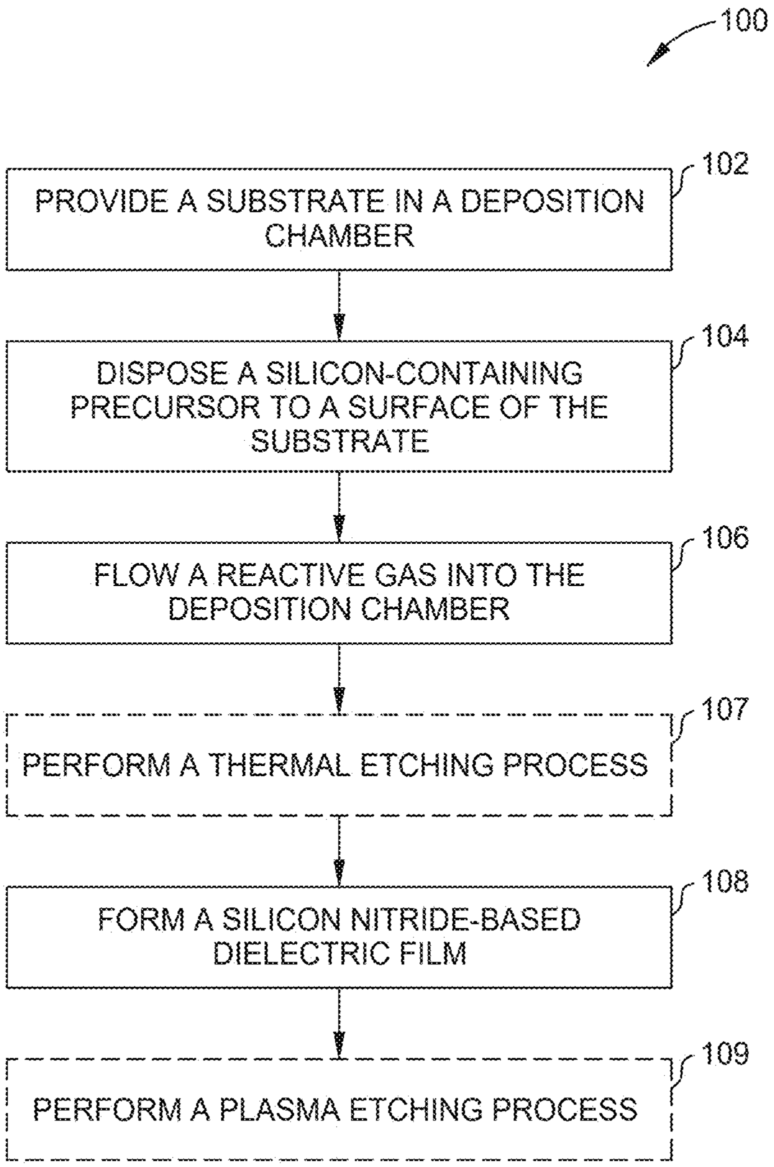
FIG. 1 is a flowchart showing a method of gap fill deposition, according to embodiments of the disclosure.

FIG. 1 is a flow chart of a method 100 for processing a substrate having features during the fabrication of a microelectronic device, according to one or more embodiments described and discussed herein. The method 100 includes gap fill deposition, etching, and recovery processes.

At operation 102, a substrate is provided in a processing chamber. A substrate, for example, may be a metal substrate, such as aluminum or stainless steel, a semiconductor substrate, such as silicon, silicon-on-insulator (SOI), or gallium arsenide, a glass substrate, or a plastic substrate. A semiconductor substrate may be a patterned substrate at any stage of manufacture/fabrication in the formation of integrated circuits. The patterned substrate may include one or more features, e.g., gaps, trenches, holes, vias, fins, columns, film stacks, layers, films, or other structures disposed on the substrate, that are to be filled with dielectric material. For example, the features can be or include a plurality of fins, where each fin contains a film stack. The film stack can include alternating pairs of layers disposed on one another. In one or more examples, each of the pairs of layers contains silicon-germanium layers and silica layers. Each of the silicon-germanium layers and silica layers can independently be deposited or formed by an epitaxial growth process or an atomic layer deposition (ALD) process.

In one or more embodiments, the features can be or include a plurality of silicon-germanium/silicon (SiGe/Si) fin structures or a plurality of germanium/silicon (Ge/Si) fin structures. In some examples, each of the SiGe layers, the Si layers, or the Ge layers has a thickness of about 5 nm to about 30 nm, such as about 5 nm, about 8 nm, or about 10 nm to about 12 nm, about 15 nm, about 20 nm, about 25 nm, or about 30 nm.

At operation 104, one or more dielectric precursors can be flowed into the processing chamber via a delivery device, such as a dual channel showerhead (DCSH). The dielectric precursors may be delivered to a surface of the substrate at a flow rate of about 5 sccm to about 5000 sccm per channel of the DSCH, e.g., about 5 sccm to about 250 sccm, about 250 sccm to about 1000 sccm, about 1000 sccm to about 2000 sccm, about 2000 sccm to about 3000 sccm, about 3000 sccm to about 4000 sccm, or about 4000 sccm to about 5000 sccm. The surface of the substrate can be about 40° C. and about 150° C., e.g., about 40° C. to about 60° C., about 60° C. to about 80° C., about 80° C. to about 100° C., about 100° C. to about 120° C., about 120° C. to about 140° C., or about 140° C. to about 150° C. The pressure of the processing chamber can be about 0.5 Torr to about 3 Torr, e.g., about 0.5 Torr to about 1 Torr, about 1 Torr to about 2 Torr, or about 2 Torr to about 3 Torr.

In some embodiments, the dielectric precursor is an organosilicon compound. For example, the organosilicon compound can include a compound having silicon, hydrogen, and/or a combination thereof. In an embodiment, the organosilicon compound can include silane. In some embodiments the dielectric precursor may be delivered to the surface of the substrate using a carrier gas, e.g., argon, hydrogen, helium, or a combination thereof. In an embodiment, the carrier gas may be delivered at a flow rate of about 250 sccm to about 5000 sccm per channel of the DSCH, e.g., about 250 sccm to about 1000 sccm, about 1000 sccm to about 2000 sccm, about 2000 sccm to about 3000 sccm, about 3000 sccm to about 4000 sccm, or about 4000 sccm to about 5000 sccm.

In an embodiment, a flow ratio of about 1:100 to about 1:500 of dielectric precursor to carrier gas, e.g., about 1:100 to about 1:125, about 1:125 to about 1:166, or about 1:166 to about 1:500. Without being bound by theory, a higher ratio of carrier gas to dielectric precursor can increase selective deposition of the dielectric precursor to the bottom of the gap. In an embodiment, the dielectric precursor may be delivered to produce an amorphous silica layer formed on and/or over the features.

The amorphous silica layer can have a thickness of about 20 nm to about 1,000 nm, e.g., about 50 nm to about 1,000 nm, about 50 nm to about 800 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 80 nm to about 1,000 nm, about 80 nm to about 800 nm, about 80 nm to about 600 nm, about 80 nm to about 500 nm, about 80 nm to about 400 nm, about 80 nm to about 300 nm, about 80 nm to about 200 nm, about 80 nm to about 100 nm, about 100 nm to about 1,000 nm, about 100 nm to about 800 nm, about 100 nm to about 600 nm, about 100 nm to about 500 nm, about 100 nm to about 400 nm, about 100 nm to about 300 nm, about 100 nm to about 250 nm, or about 100 nm to about 200 nm.

At operation 106, one or more reactive gases, e.g., hydrogen, can be flowed into the processing chamber via the delivery device to form a modified amorphous silica layer. The one or more reactive gases may interact with the amorphous silica layer to form an etchant gas, e.g., $SiH_4$. The etchant gas may react with the amorphous silica to form Si—H, Si—Si, and Si—$H_2$ at the surface of the amorphous silica layer to form the modified amorphous silica layer.

In some embodiments, at operation 107, a thermal etching process may be performed on the modified amorphous silica layer. The thermal etching process can include flowing a fluorine-containing compound, such as HF, $NF_3$, or a combination thereof, over the modified amorphous silica layer at a temperature of about 400° C. to about 600° C., e.g., about 400° C. to about 450° C., about 450° C. to about 500° C., about 500° C. to about 550° C., or about 550° C. to about 600° C. For example, the thermal etching process can include flowing $NF_3$ over the modified amorphous silica layer at a temperature of about 450° C. In an embodiment, the temperature of about 400° C. to about 600° C. may allow for the $NF_3$ to act as a strong oxidizing agent, reacting with the Si—Si and Si—$H_2$ bonds at the surface of the modified amorphous silica layer to form a uniform layer of Si—H bonds. Without being bound by theory, a uniform layer of Si—H bonds may allow for single layers of Si—H to be nitrated to Si—N—H, Si—$N_2$, or Si—N, as described below, to promote uniform deposition of a dielectric films on the substrate.

The fluorinated compound may be delivered to the substrate at a flow rate of about 500 sccm to about 3000 sccm, e.g., about 500 sccm to about 1000 sccm, about 1000 sccm to about 2000 sccm, or about 2000 sccm to about 3000 sccm. The fluorinated compound may be delivered for a period of about 5 seconds(s) to about 60 s, e.g., about 5 s to about 10 s, about 10 s to about 20 s, about 20 s to about 40 s, or about 40 s to about 60 s. Alternatively, the fluorinated compound may be delivered for a period of greater than 60 s. The pressure of the processing chamber during the thermal etching process can be about 4 Torr to about 6 Torr, e.g., about 4 Torr to about 4.5 Torr, about 4.5 Torr to about 5 Torr, or about 5 Torr to about 6 Torr.

Without being bound by theory, the thermal etching process may prevent and/or reduce defects from forming at the surface of the modified amorphous silica layer, increasing uniformity on the feature of the substrate. Moreover, the thermal etching process may form the uniform layer of the Si—H bonds, reducing and/or eliminating the need for an argon plasma etching step, while maintaining the film quality of the SiN dielectric film.

At operation 108, one or more radicals (also referred to as reactive gas) in the substrate processing region react with the modified amorphous silica layer to form a silicon nitride SiN-based dielectric film. The radicals may be generated by a plasma generated in a remote plasma source (RPS) outside the processing chamber. The radicals may be flowed into a substrate processing region of the processing chamber along with a carrier gas (e.g., Ar, He). The plasma can be generated by the dissociation of a processing precursor gas including molecular oxygen ($O_2$), ozone ($O_3$), molecular hydrogen ($H_2$), a nitrogen-hydrogen compound (e.g., $NH_3$, $N_2H_4$), a nitrogen-oxygen compound (e.g., NO, $NO_2$, $N_2O$), a hydrogen-oxygen compound (e.g., $H_2O$, $H_2O_2$), a nitrogen-hydrogen-oxygen compound (e.g., $NH_4OH$), a carbon-oxygen compound (e.g., CO, $CO_2$), a fluorine-containing compound (e.g., $NF_3$), or a combination thereof. In the plasma, O*, H*, F*, and/or N*-containing radicals may be activated, such as O*, H*, F*, N*, $NH_3$*, $N_2H_4$*, $NH_2$*, NH*, N*O*, $C_3H_6$*, $C_2H_2$*, or a combination thereof.

In an embodiment, the ion energy of the radicals may be about 25 eV to about 70 eV, e.g., about 25 eV to about 40 eV, about 40 eV to about 60 eV, or about 60 eV to about 70 eV. Without being bound by theory, an ion energy of the radicals that is about 25 eV to about 70 eV may reduce defect formation, e.g., bubbles, in the SiN-based dielectric film. In an embodiment, the dosage value of the radicals may be about $1\times10^{20}$ ion/cm$^2$ to about $6\times10^{20}$ ion/cm$^2$ during the plasma treatment, e.g., about $1\times10^{20}$ ion/cm$^2$, to about $2\times10^{20}$ ion/cm$^2$, about $2\times10^{20}$ ion/cm$^2$, to about $3\times10^{20}$ ion/cm$^2$, about $3\times10^{20}$ ion/cm$^2$, to about $4\times10^{20}$ ion/cm$^2$, about $4\times10^{20}$ ion/cm$^2$, to about $5\times10^{20}$ ion/cm$^2$, or about $5\times10^{20}$ ion/cm$^2$, to about $6\times10^{20}$ ion/cm$^2$. Without being bound by theory, dosage value of the radicals that is about $1\times10^{20}$ ion/cm$^2$, to about $6\times10^{20}$ ion/cm$^2$ may reduce defect formation, e.g., bubbles, in the SiN-based dielectric film.

In some embodiments, the radicals activated in the RPS are flowed into the processing chamber (referred to as "radical flux") at a flow rate between about 1 sccm and about 10000 sccm. The composition of the formed SiN-based dielectric film can be adjusted by changing the composition of the reactive gas in the radical flux. To form a nitrogen-containing film, such as SiON, SiCON, and SiN films, the reactive gas may be, for example, ammonia ($NH_3$), hydrogen ($H_2$), hydrazine ($N_2H_4$), nitrogen dioxide ($NO_2$), or nitrogen ($N_2$). Without being bound by theory, when the reactive gas in the substrate processing region reacts with the delivered dielectric precursor, Si—H and N—H bonds (weaker bonds) are partially broken and replaced by Si—N, Si—NH, and/or Si—$NH_2$ bonds (stronger bonds) to form a SiN-dielectric film.

The formed silicon nitride (SiN)-based dielectric film can be exposed to a plasma containing light ions (e.g., ionized species having small atomic numbers in the periodic table), such as argon (e.g., Ar), nitrogen (e.g., $N_2$), or fluorine-containing compounds, (e.g., $NF_3$) in a plasma chamber to promote selective etching of the top of the gap. The plasma chamber is coupled to two power sources, an RF power source, which controls density of ion flux (also referred to as ion dose), via inductive coils and a DC bias, which controls ion energy.

The RF source can have a power of about 40 watts (W) to about 60 W, e.g., about 40 W to about 45 W, about 45 W to about 50 W, about 50 W to about 55 W, or about 55 W to about 60 W, when operating at a very high frequency of about 20 MHz to about 30 MHZ, e.g., about 20 MHz to about 22 MHZ, about 22 MHz to about 24 MHZ, about 24 MHz to about 26 MHz, about 26 MHz to about 28 MHz, or about 28 MHz to about 30 MHz during the plasma treatment. In an embodiment, the plasma may have a power of about 50 Hz when operating at a frequency of about 27 MHz.

The DC bias can have a voltage of about 0.1 kV to about 10 KV, about 0.1 kV to about 8 kV, about 0.1 kV to about 7 kV, about 0.1 kV to about 6 kV, about 0.1 kV to about 5 kV, about 0.1 KV to about 4 kV, about 0.1 KV to about 2 kV, about 0.1 kV to about 1 kV, about 0.1 kV to about 0.5 kV, about 1 KV to about 10 KV, about 1 kV to about 8 kV, about 1 KV to about 7 kV, about 1 kV to about 6 kV, about 1 kV to about 5 kV, about 1 kV to about 4 KV, about 3 kV to about 10 kV, about 3 kV to about 8 kV, about 3 kV to about 7 kV, about 3 kV to about 6 kV, or about 3 kV to about 5 kV during the plasma treatment.

In some embodiments, and at operation 109, a fluorine-containing compound, such as HF, $NF_3$, or a combination thereof, may be introduced to the chamber to promote selective etching of the top of the gap. The fluorine-containing compound may be introduced at a flow rate of about 5 sccm to about 500 sccm, e.g., about 5 sccm to about 50 sccm, about 50 sccm to about 100 sccm, about 100 sccm to about 300 sccm, or about 300 sccm to about 500 sccm. The fluorine-containing compound may be introduced at a pressure of about 0.1 Torr to about 3 Torr, e.g., about 0.1 Torr to about 1 Torr, about 1 Torr to about 2 Torr, or about 2 Torr to about 3 Torr. The fluorine-containing compound may be introduced for a period of about 1 s to about 60 s, e.g., about 1 s to about 20 s, about 20 s to about 40 s, or about 40 s to about 60 s. The fluorine-containing compound may be introduced at a temperature of about 400° C. to about 600° C., e.g., about 400° C. to about 450° C., about 450° C. to about 500° C., about 500° C. to about 550° C., or about 550° C. to about 600° C. In an embodiment, the temperature of about 400° C. to about 600° C. may allow for the $NF_3$ to selectively etch the SiN-based dielectric film at a top of the gap, with minimal and/or no etching of the SiN-based dielectric film at a bottom of the gap.

The formed silicon nitride (SiN)-based dielectric film can be exposed to a recovery process. The recovery process can include a hydrogen, e.g., $H_2$, recovery process. In an embodiment, hydrogen may react with the plasma treated SiN dielectric film to remove one or more defects and/or bubbles on the SiN dielectric film. In an embodiment, the recovery process can include exposing the plasma treated SiN-based dielectric film to a recovery plasma. A recovery plasma includes a plasma containing one or more hydrogen ions, e.g., H*, in a plasma chamber. The hydrogen ion may be introduced at a flow rate of about 500 sccm to about 2500 sccm, e.g., about 500 sccm to about 1000 sccm, about 1000 sccm to about 1500 sccm, about 1500 sccm to about 2000 sccm, or about 2000 sccm to about 2500 sccm. The hydrogen ion may be introduced at a pressure of about 0.1 Torr to about 3 Torr, e.g., about 0.1 Torr to about 1 Torr, about 1 Torr to about 2 Torr, or about 2 Torr to about 3 Torr. The hydrogen ion may be introduced for a period of about 1 s to about 60 s, e.g., about 1 s to about 20 s, about 20 s to about 40 s, or about 40 s to about 60 s. The hydrogen ion may be introduced at a temperature of about 400° C. to about 600° C., e.g., about 400° C. to about 450° C., about 450° C. to about 500° C., about 500° C. to about 550° C., or about 550° C. to about 600° C. In an embodiment, the hydrogen ions may react with the $SiF_4$ bonds formed as a result of the $NF_3$ plasma treatment, causing Si—H bonds to form.

In an embodiment, the exposure to the recovery plasma in conjunction with the hydrogen ions can cause further cross-linking between the formed Si—H bonds and the N—H bonds in the formed SiN-based dielectric film. Without being bound by theory, it is believed that radicals of hydrogen ions activated in the plasma may physically bombard Si—H bonds within the SiN-based dielectric film, thereby breaking the Si—H bonds and causing formation of Si—N, Si—NH, and/or Si—$NH_2$ bonds. The hydrogen ions travel through the formed SiN-based dielectric film to a selected depth without substantially damaging the formed SiN-based dielectric film. This treatment by radicals of the hydrogen ions makes it possible to remove one or more defects and/or bubbles formed from the $NF_3$ plasma etching process increasing the homogeneity to a depth ranging from 1 nm to 5 nm, such as from 3 nm to 4 nm, without damaging the formed SiN-based dielectric film.

The plasma chamber is coupled to two power sources, an RF power source, which controls density of ion flux (also referred to as ion dose), via inductive coils and a DC bias, which controls ion energy.

The RF source can have a power of about 200 watts (W) to about 300 W, e.g., about 200 W to about 220 W, about 220 W to about 240 W, about 240 W to about 260 W, about 260 W to about 280 W, or about 280 W to about 300 W, when operating at a very high frequency of about 20 MHz to about 30 MHZ, e.g., about 20 MHz to about 22 MHz, about 22 MHz to about 24 MHZ, about 24 MHz to about 26 MHZ, about 26 MHz to about 28 MHz, or about 28 MHz to about 30 MHz, during the plasma treatment. In an embodiment, the plasma may have a power of about 240 Hz when operating at a frequency of about 27 MHz.

The DC bias can have a voltage of about 0.1 kV to about 10 KV, about 0.1 kV to about 8 kV, about 0.1 kV to about 7 kV, about 0.1 kV to about 6 kV, about 0.1 kV to about 5 kV, about 0.1 kV to about 4 KV, about 0.1 kV to about 2 kV, about 0.1 kV to about 1 kV, about 0.1 kV to about 0.5 kV, about 1 kV to about 10 KV, about 1 kV to about 8 kV, about 1 kV to about 7 kV, about 1 kV to about 6 kV, about 1 KV to about 5 kV, about 1 kV to about 4 KV, about 3 kV to about 10 KV, about 3 kV to about 8 kV, about 3 kV to about 7 kV, about 3 kV to about 6 kV, or about 3 kV to about 5 kV during the plasma treatment.

In general, the set of operations (e.g. blocks 104-109) may be repeated for multiple cycles to form an overall thicker film.

Figure 2:
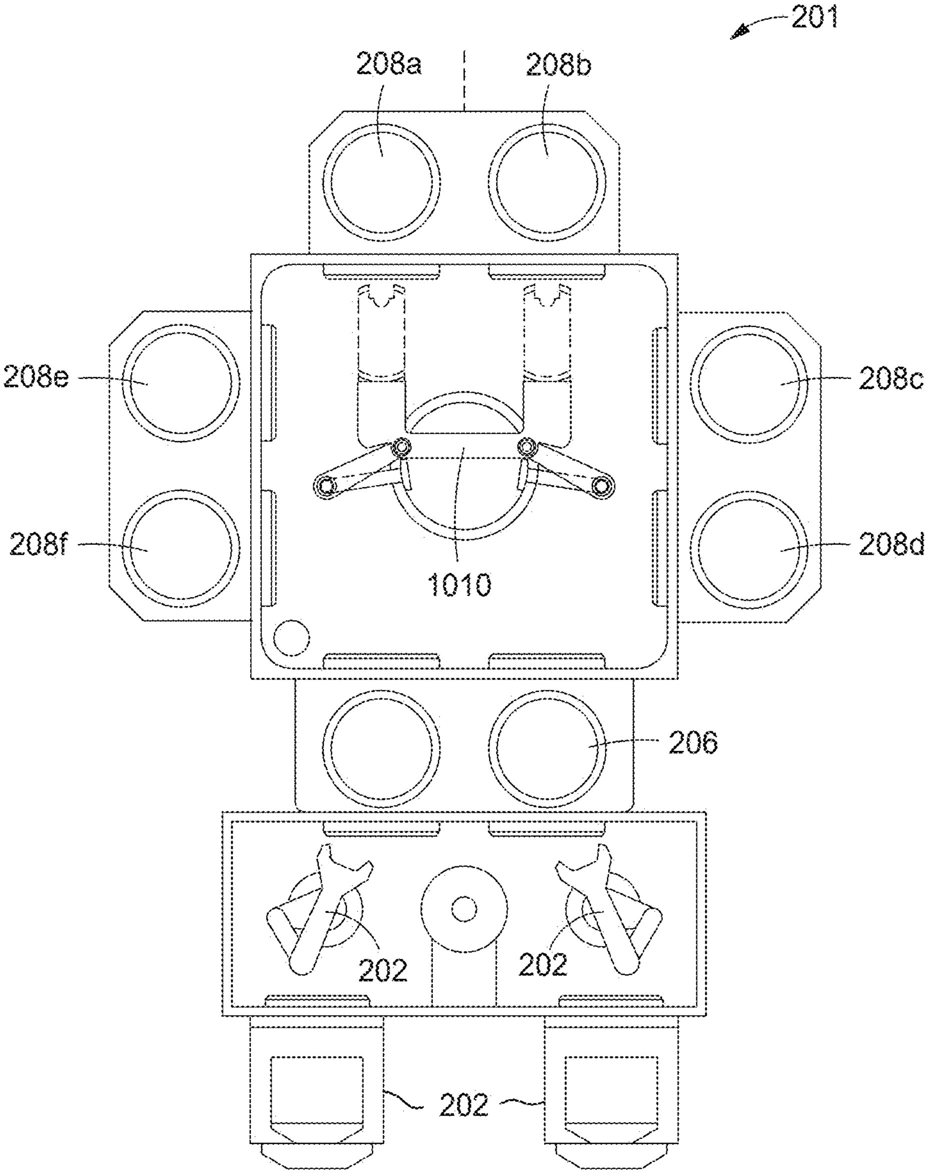
FIG. 2 is a schematic view of a cluster tool, according to embodiments of the disclosure.

Embodiments of the deposition systems and techniques may be incorporated into larger fabrication systems for producing integrated circuit chips. FIG. 2 shows one such cluster tool 201 that includes processing chambers 208*a*-*f*, according to one embodiment. In FIG. 2, a pair of front opening unified pods (FOUPs) 202 supply substrates (e.g., 300 mm diameter wafers) that are received by robotic arms 104 and placed into a low pressure holding area 206. A second robotic arm 210 may be used to transport the substrate between the lower pressure holding area 206 and the processing chambers 208*a*-*f*.

Figure 3A:
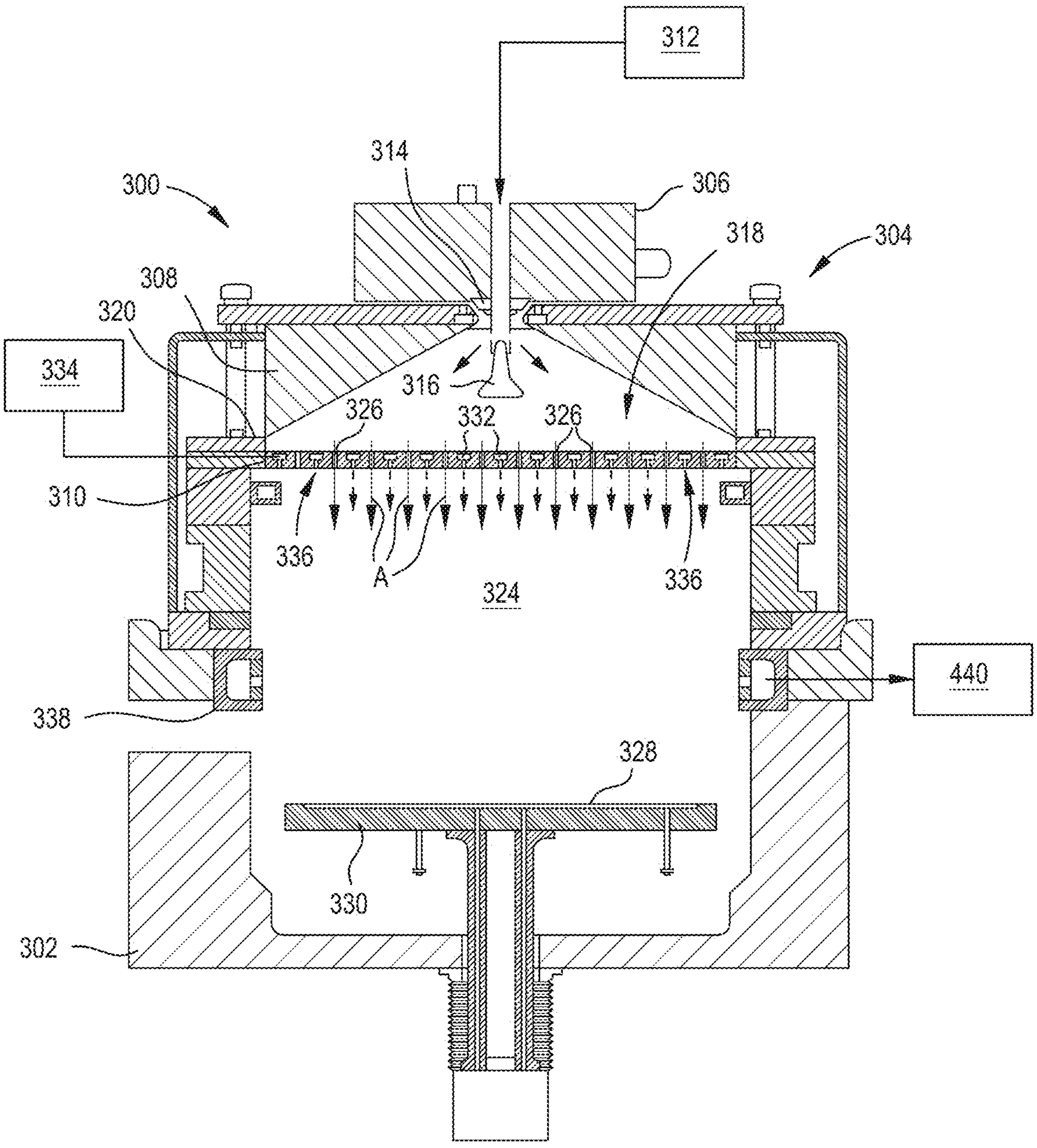
FIG. 3A is a schematic view of a processing chamber, according to embodiments of the disclosure.

FIG. 3A is a schematic view of a processing chamber 300 having a chamber body 302 and lid assembly 304, according to one embodiment. The lid assembly 304 generally includes a remote plasma source (RPS) 306, a lid 308, and a dual channel showerhead (DCSH) 310. The RPS 306 may process a processing precursor gas provided from a processing precursor gas source 312. The plasma formed in the RPS 306 may be then delivered through a gas inlet assembly 314 and baffle 316, which are coupled to the lid 308, and into a chamber plasma region 318. A carrier gas (e.g., Ar, He) may be delivered into the chamber plasma region 318. The lid (that is a conductive top portion) 308 and the dual channel showerhead (DCSH) 310 are disposed with an insulating ring 320 in between, which allows an AC potential to be applied to the lid 308 relative to the DCSH 310.

The DCSH 310 is disposed between the chamber plasma region 318 and a substrate processing region 324 and allows radicals activated in the plasma present within the chamber plasma region 318 to pass through a plurality of through-holes 326 into the substrate processing region 324. The flow of the radicals (radical flux) is indicated by the solid arrows “A” in FIG. 3A. A substrate 328 is disposed on a substrate support 330 disposed within the substrate processing region 324. The DCSH 310 also has one or more hollow volumes 332 which can be filled with a dielectric precursor provided from a precursor source 334. The dielectric precursor passes from the one or more hollow volumes 332 through small holes 336 and into the substrate processing region 324, bypassing the chamber plasma region 318. The flow of the dielectric precursor is indicated by the dotted arrows in FIG. 3A. An exhaust ring 338 is used to uniformly evacuate the substrate processing region 324 by use of an exhaust pump 340. The DCSH 310 may be thicker than the length of the smallest diameter of the through-holes 326. The length of the smallest diameter of the through-holes 326 may be restricted by forming larger diameter portions of through-holes 326 partially through the DCSH 310, to maintain a flow of radical flux from the chamber plasma region 318 into the substrate processing region 324. In some embodiments, the length of the smallest diameter of the through-holes 326 may be the same order of magnitude as the smallest diameter of the through-holes 326 or less.

In some embodiments, a pair of processing chambers (e.g., 208*c*-*d*) in FIG. 2 (referred to as a twin chamber) may be used to deposit a dielectric precursor on the substrate. Each of the processing chambers (e.g., 208*c*-*d*) can have a cross-sectional structure of the processing chamber 300 depicted in FIG. 3A. The flow rates per channel of the DCSH described above correspond to flow rates into each of the chambers (e.g., 208*c*-*d*) via the corresponding DCSH 310.

Figure 3B:
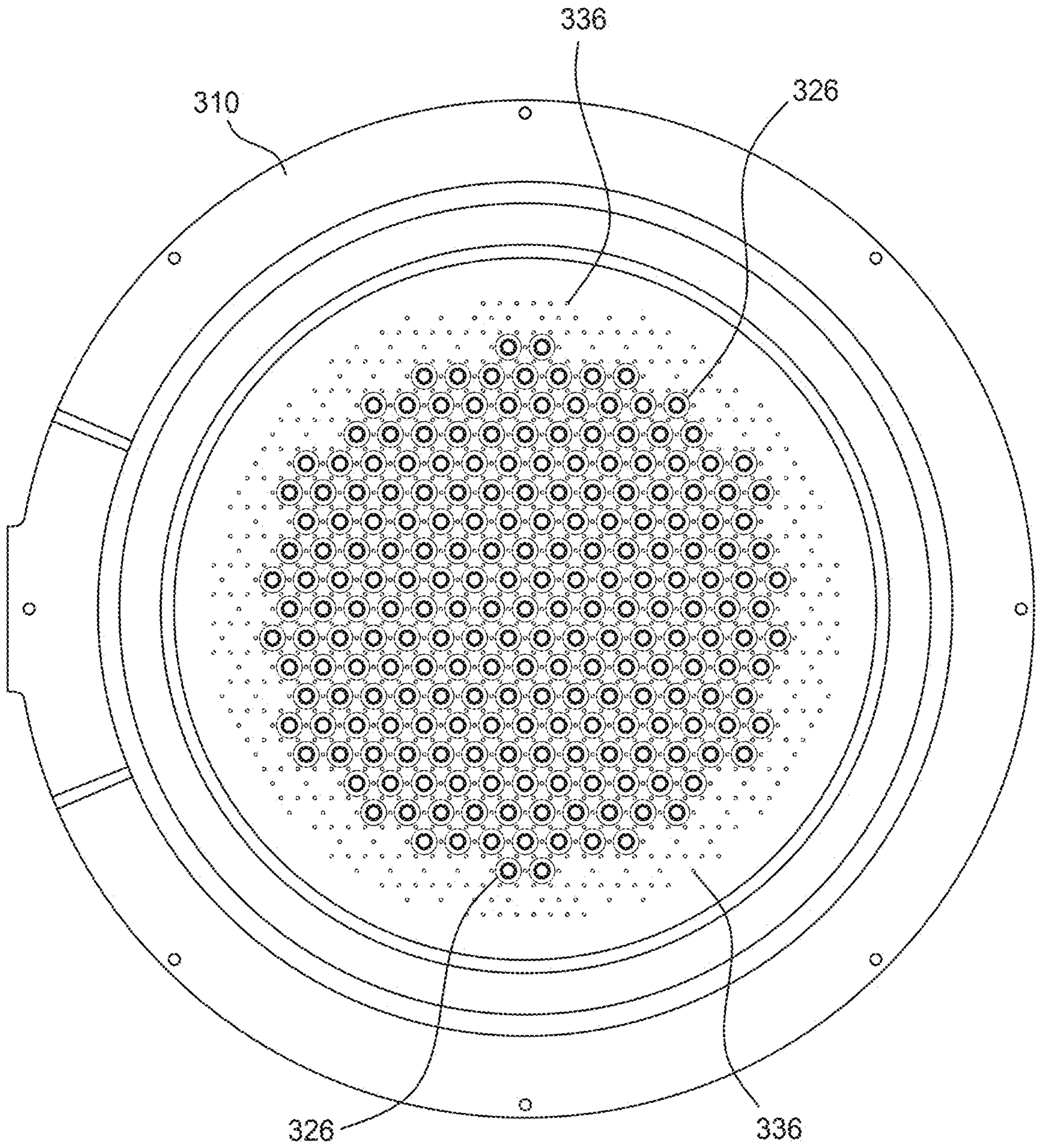
FIG. 3B is a schematic bottom view of a shower head, according to embodiments of the disclosure.

FIG. 3B is a schematic bottom view of the DCSH 310 according to one embodiment. The DCSH 310 may deliver via through-holes 326 the radical flux and the carrier gas present within the chamber plasma region 318.

In some embodiments, the number of through-holes 326 may be about 60 holes to about 2000 holes. Through-holes 326 may have round shapes or a variety of shapes. In some embodiments, the smallest diameter of through-holes 326 may be about 0.5 mm to about 20 mm, such as about 1 mm to about 6 mm. The cross-sectional shape of through-holes 326 may be made conical, cylindrical or a combination of the two shapes. In some embodiments, a number of small holes 336 may be used to introduce a dielectric precursor into the substrate processing region 324 and may be about 100 holes to about 5000 holes or about 500 holes to about 2000 holes. The diameter of the small holes 336 may be about 0.1 mm to about 2 mm.

Figure 4:
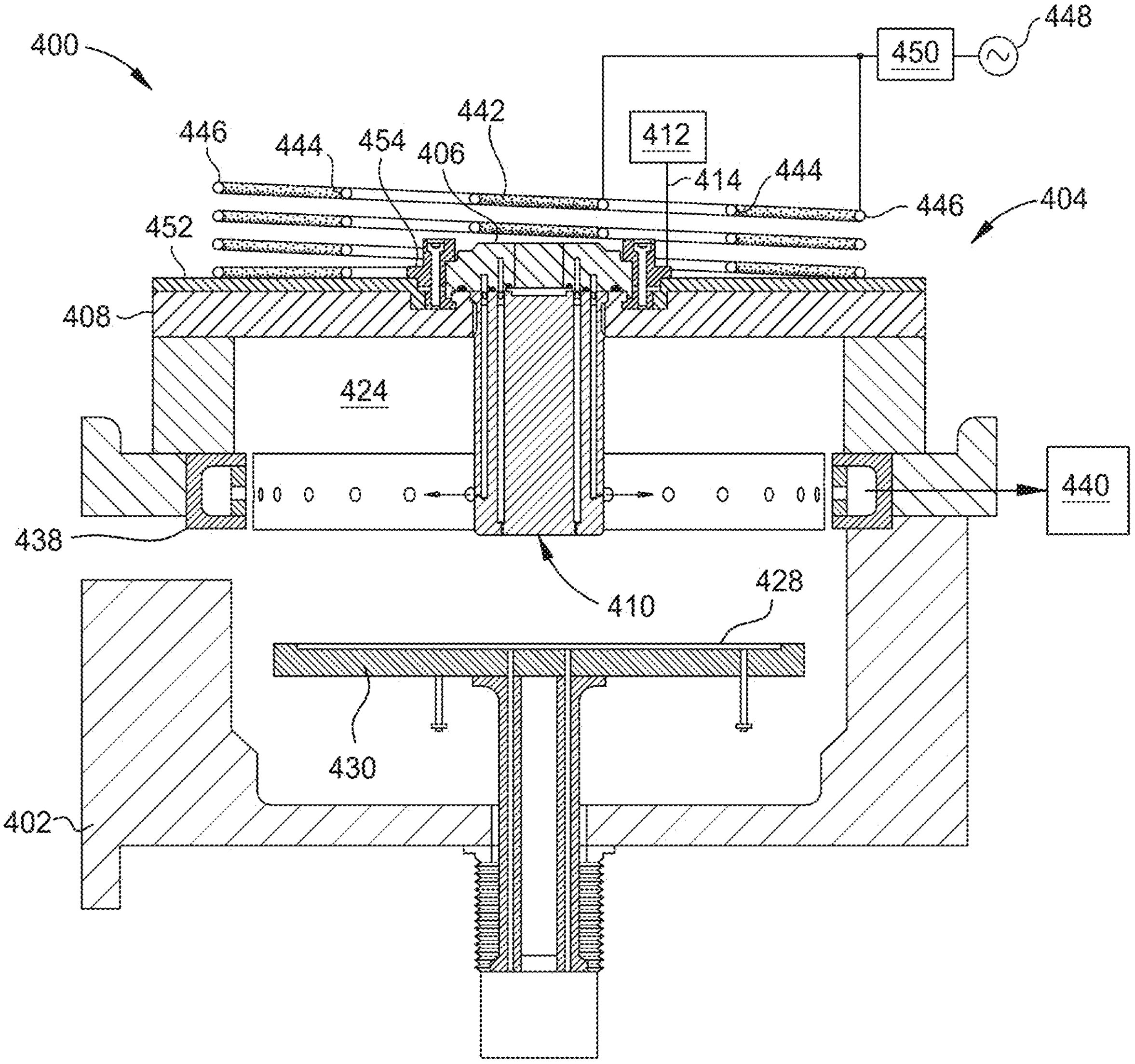
FIG. 4 is a schematic view of a plasma chamber, according to embodiments of the disclosure.

FIG. 4 is a schematic view of a plasma chamber 400 having a chamber body 402 and lid assembly 404, according to one embodiment. The lid assembly 404 includes a gas delivery assembly 406 and a lid 408. The lid 408 has an opening 410 to allow entrance of one or more processing precursor gases. The gas delivery assembly 406 is disposed over the lid 408 through the opening 410. The gas delivery assembly 406 may be connected to a gas source 412 through a gas inlet 414 to supply one or more processing precursor gases into a substrate processing region 424. A substrate 428 is disposed on a substrate support 430 disposed within the substrate processing region 424 and coupled to a bias power source (not shown). The one or more processing precursor gases may exit the substrate processing region 424 by use of an exhaust ring 438 and an exhaust pump 440.

In the lid assembly 404, inner coils 442, middle coils 444, and outer coils 446 are disposed over the lid 408. The inner coils 442 and the outer coils 446 are coupled to an RF power source 448 through a matching circuit 450. Power applied to the outer coils 446 from the RF power source 448 is inductively coupled through the lid 408 to generate plasma from the processing precursor gases provided from the gas source 412 within the substrate processing region 424. The RF power source 448 can provide current at different frequencies to control the plasma density (i.e., number of ions per cc) in the plasma and thus the density of ion flux (ions/cm$^2$·sec). The bias power source controls a voltage between the substrate 428 and the plasma, and thus controls the energy and directionality of the ions. Thus, both ion flux and ion energy can be independently controlled.

A heater assembly 452 may be disposed over the lid 408. The heater assembly 452 may be secured to the lid 408 by clamping members 454, 456.

The surface of the substrate can be held at a temperature of about 100° C. to about 500° C., e.g., about 450° C. A pressure of the plasma chamber may be maintained at about 5 m Torr to about 500 mTorr.

Overall, various embodiments of the present disclosure allow for the selective etching of the top of the gap without etching, or with limited etching, of the bottom of the gap, increasing the uniformity of the dielectric material in the gap. Moreover, defects, e.g., bubbling, may be removed to provide a uniform layer of the dielectric material in the gap using the recovery process. Additionally, a reduction of the buildup of the dielectric material may form by nitrating a single layer of the silicon oxide to form silicon nitride without forming defects and/or altering the silicon nitride film quality.

Example 1

Figure 5:
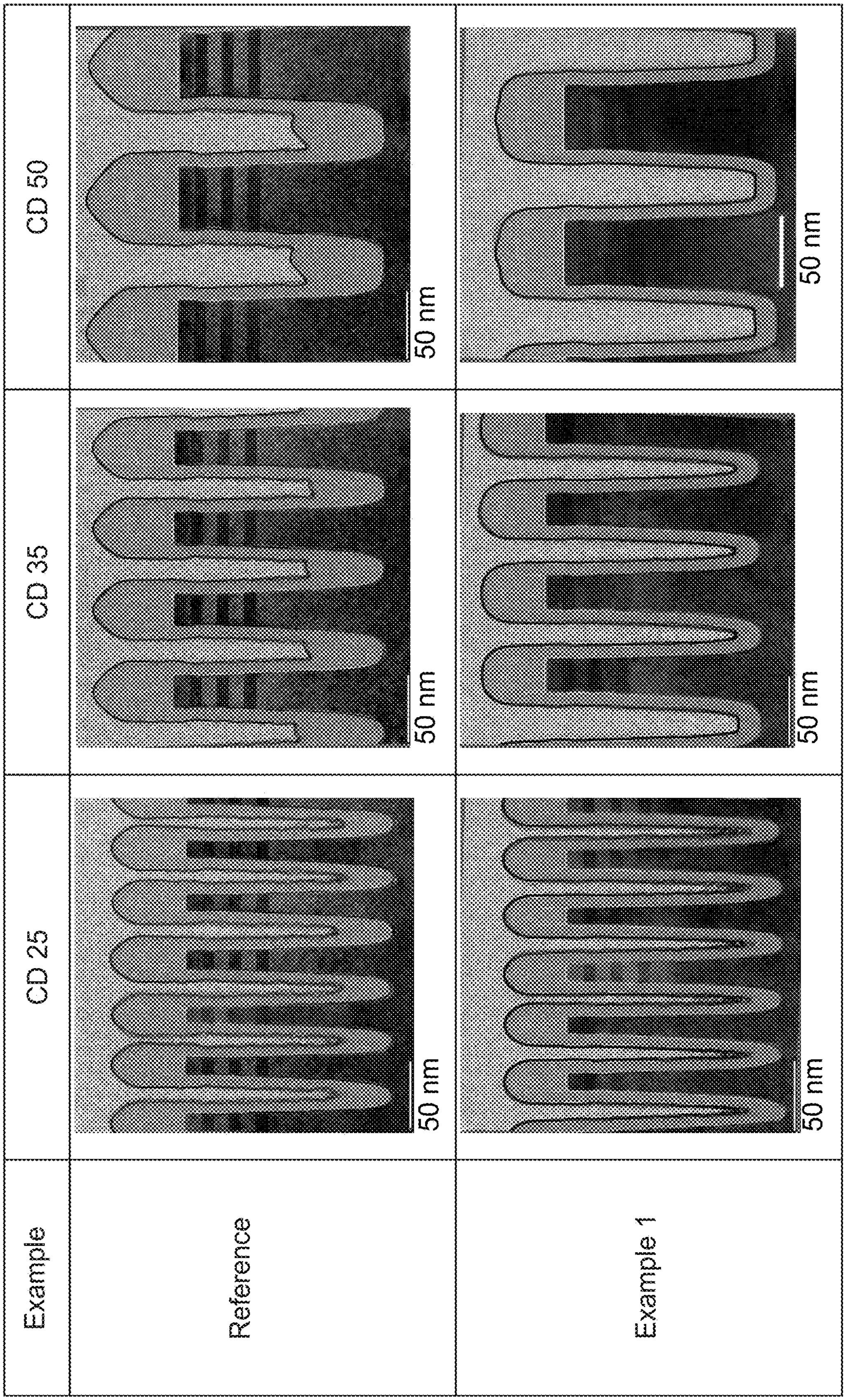
FIG. 5 is a table showing a comparison of a reference SiN-based dielectric film having a bottom film that is thicker than a side wall and trench top film thickness compared to a SiN-based dielectric film produced using a thermal NF3 etching process, according to embodiments of the disclosure.

A reference SiN-based dielectric film was compared to a SiN-based dielectric film produced using a $NF_3$ thermal etching process. Samples were analyzed at a critical dimension of 25 nm, 35 nm, and 50 nm. The films were prepared by flowing 10 sccm $SiH_4$ and 2900 sccm $H_2$ at a pressure of 0.8 Torr for 39 seconds to deposit an amorphous silica layer. The spacing was 1600 mil. The power was 60 W at 27 MHz. 4500 sccm Ar and 600 sccm $H_2$ was introduced to the amorphous silica layer at a pressure of 2.1 Torr for 10 seconds. The spacing was 555 mil, and the power was 60 W. A thermal etching step using a $NF_3$ thermal etching process was performed on the example film by flowing 2000 sccm $NF_3$, 4000 sccm clean Ar (argon flowing from a remote plasma source), and 1000 sccm process Ar (argon flowing from a process gas panel) at a pressure of 5 Torr for 8 seconds. The power was 0 W, and the spacing was 300 mil. The films were then exposed to 2500 sccm $N_2$ at a pressure of 5.5 Torr for 60 seconds. The power was 1000 W, and the spacing was 555 mil. The use of the $NF_3$ thermal etching allowed for a uniform Si—N—H dielectric film to be produced, with limited defects, as shown in FIG. 5. Additionally, the SiN film quality as compared to conventional SiN films was similar, reducing and/or eliminating the need for a plasma etching process after nitridation.

Example 2

A reference SiN-based dielectric film was compared to a SiN-based dielectric film produced using a plasma $NF_3$ etching process. Samples were analyzed at a critical dimension of 25 nm, 35 nm, and 50 nm. The films were prepared by flowing 10 sccm $SiH_4$ and 2900 sccm $H_2$ at a pressure of 0.8 Torr for 39 seconds to deposit an amorphous silica layer. The spacing was 1600 mil. The power was 60 W at 27 MHz. 4500 sccm Ar and 600 sccm $H_2$ was introduced to the amorphous silica layer at a pressure of 2.1 Torr for 10 seconds. The spacing was 555 mil, and the power was 60 W. The films were then exposed to 2500 sccm $N_2$ at a pressure of 5.5 Torr for 60 seconds. The power was 1000 W, and the spacing was 555 mil.

Figure 6:
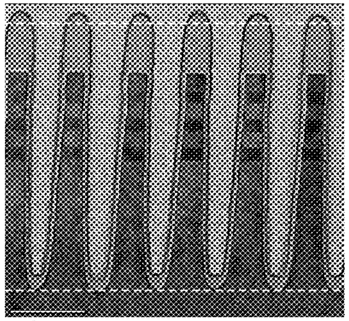
FIG. 6 is a table showing a comparison of a reference SiN-based dielectric film compared to a SiN-based dielectric film produced using a plasma NF3 etching process, according to embodiments of the disclosure.
Figure 6:
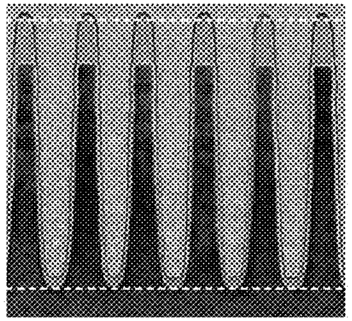

The Si—N based dielectric film was then etched using a plasma in the presence of $NF_3$. $NF_3$ was introduced at a flow rate of 15 sccm, for a period of 15 seconds, to a plasma operating at 50 W, with a frequency of 27 MHz. The pressure was 1 Torr, and the spacing was 300 mil. A carrier gas of Argon was introduced at 300 sccm. The temperature was 450° C. The SiN-based dielectric film was then treated according to a recovery process. Hydrogen gas was introduced at a flow rate of 2500 sccm, for a period of 20 seconds, to a plasma operating at 250 W and a frequency of 27 MHz. The pressure was 2.5 Torr and the spacing was 555 mil. The use of the plasma $NF_3$ etching allowed for selective top etching compared to bottom etching, as the bottom to top ratio increased from 0.9 to 3.5, promoting a uniform SiN-based dielectric film on the features of the substrate, as shown in FIG. 6.

Example 3

A number of defects present in a SiN-based dielectric film was analyzed. A first and second SiN-based dielectric film were produced using a plasma $NF_3$ etching process. The first film was used as a reference, while the second film was treated by a recovery process that introduced $H_2$ at a flow rate of 2500 sccm while operating a plasma at 250 W and a frequency of 27 MHz. The pressure was 2.5 Torr, the dosage time was 20 seconds, and the spacing was 555 mil. The first film was overloaded with defects, e.g., greater than 100,000 defects. Alternatively, the second film contained only 11 defects present in the SiN-based dielectric film. Without being bound by theory, the recovery process including a hydrogen ion reduced the number of defects present in the SiN-based dielectric film, increasing the film quality.

Example 4

Figure 7:
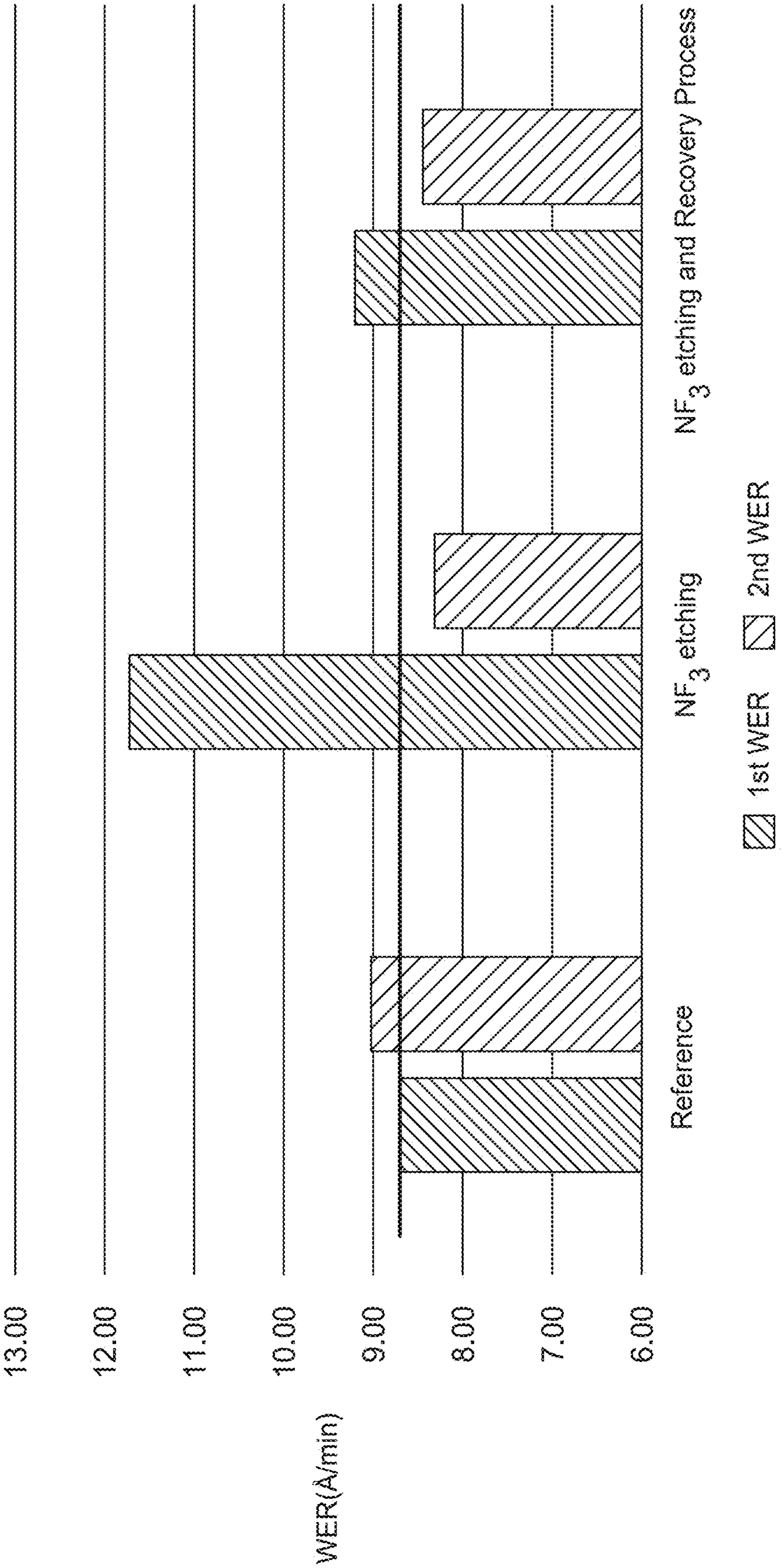
FIG. 7 is a graph showing a wet etch rate of a reference SiN-based dielectric film, a SiN-based dielectric film produced using a plasma NF3 etching process, and a SiN-based dielectric film produced using a plasma NF3 etching process and a recovery process, according to embodiments of the disclosure.

A first wet etch rate and second wet etch rate of a conventional SiN-based dielectric film, SiN-based dielectric film produced using plasma $NF_3$ etching, and a SiN-based dielectric film produced using plasma $NF_3$ etching treated with a recovery process was determined. The first wet etch rate was determined on surface of the SiN-based dielectric film, while the second wet etch rate was determined after the first wet etch rate on a location of the SiN-based dielectric film below the surface. The SiN-based dielectric film produced using plasma $NF_3$ etching had the highest wet etch rate due to the variations of film surface quality after exposure to the $NF_3$. However, after the recovery process was performed on the dielectric film, the wet etch rate returned to that of a conventional SiN-based dielectric film, as shown in FIG. 7.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term “comprising” is considered synonymous with the term “including” for purposes of United States law. Likewise, whenever a composition, an element, or a group of elements is preceded with the transitional phrase “comprising”, it is understood that the same composition or group of elements with transitional phrases “consisting essentially of”, “consisting of”, “selected from the group of consisting of”, or “is” preceding the recitation of the composition, element, or elements and vice versa, are contemplated. As used herein, the term “about” refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of forming a silicon-nitride based dielectric film, comprising:

providing a substrate into a processing chamber;

forming an amorphous silica layer on a surface of the substrate by flowing a dielectric precursor and a carrier gas on the substrate;

forming a modified amorphous silica layer by flowing a reactive gas into the processing chamber;

performing a thermal etching process on the modified amorphous silica layer by flowing a fluorine-containing compound at a temperature of about 400° C. to about 600° C.; and forming a silicon-nitride based dielectric film by reacting the modified amorphous silica layer with one or more radicals generated by a remote plasma source.

2. The method of claim 1, wherein a flow ratio of the dielectric precursor to the carrier gas is about 1:100 to about 1:500.

3. The method of claim 1, wherein the reactive gas comprises $H_2$.

4. The method of claim 1, wherein the fluorine-containing compound comprises $NF_3$.

5. The method of claim 1, wherein the fluorine-containing compound is flowed at a flow rate of about 500 sccm to about 3000 sccm.

6. The method of claim 1, wherein the one or more radicals comprise hydrogen radicals.

7. The method of claim 6, wherein an energy of the hydrogen radicals is about 25 eV to about 70 eV.

8. The method of claim 6, wherein a dosage of the hydrogen radicals is about $1\times10^{20}$ ion/cm$^2$ to about $6\times10^{20}$ ion/cm$^2$.

9. A method of forming a silicon-nitride based dielectric film, comprising:

providing a substrate into a processing chamber;

forming an amorphous silica layer on a surface of the substrate by flowing a dielectric precursor and a carrier gas on the substrate;

forming a modified amorphous silica layer by flowing a reactive gas into the processing chamber;

forming a silicon-nitride based dielectric film by reacting the modified amorphous silica layer with one or more radicals generated by a remote plasma source; and forming an etched silicon-nitride based dielectric film by flowing a fluorine-containing compound to the processing chamber in the presence of a plasma.

10. The method of claim 9, wherein a flow ratio of the dielectric precursor to the carrier gas is about 1:100 to about 1:500.

11. The method of claim 9, wherein the reactive gas comprises $H_2$.

12. The method of claim 9, wherein the fluorine-containing compound comprises $NF_3$.

13. The method of claim 9, wherein the fluorine-containing compound is flowed at a flow rate of about 5 sccm to about 500 sccm.

14. The method of claim 9, wherein the plasma comprises an argon plasma.

15. The method of claim 14, wherein the plasma is generated at a power of about 40 Watts to about 60 Watts when operating at a frequency of about 20 MHz to about 30 MHz.

16. A method of forming a silicon-nitride based dielectric film, comprising:

forming an amorphous silica layer on a surface of a substrate by flowing a dielectric precursor and a carrier gas on the substrate;

forming a modified amorphous silica layer by flowing a reactive gas into a processing chamber;

forming a silicon-nitride based dielectric film by reacting the modified amorphous silica layer with one or more radicals;

forming an etched silicon-nitride based dielectric film by flowing a fluorine-containing compound to the processing chamber in the presence of a plasma; and exposing the etched silicon-nitride based dielectric film to a hydrogen recovery process in the processing chamber.

17. The method of claim 16, wherein a flow ratio of the dielectric precursor to the carrier gas is about 1:100 to about 1:500.

18. The method of claim 16, wherein the hydrogen recovery process comprises a recovery plasma configured to produce one or more hydrogen ions.

19. The method of claim 18, wherein the one or more hydrogen ions are introduced to the processing chamber at a flow rate of about 500 sccm to about 2500 sccm.

20. The method of claim 18, wherein the plasma is generated at a power of about 40 Watts to about 60 Watts when operating at a frequency of about 20 MHz to about 30 MHz.

* * * * *